United States Patent
Kim et al.

(10) Patent No.: US 12,159,194 B2
(45) Date of Patent: Dec. 3, 2024

(54) SOFTWARE-DEFINED QUANTUM COMPUTER

(71) Applicants: Duke University, Durham, NC (US); IonQ, Inc., College Park, MD (US)

(72) Inventors: Jungsang Kim, Chapel Hill, NC (US); David Moehring, Silver Spring, MD (US); Omar Shehab, Landover Hills, MD (US); Yunseong Nam, North Bethesda, MD (US); Jonathan Mizrahi, Silver Spring, MD (US); Stewart Allen, Reston, VA (US)

(73) Assignees: DUKE UNIVERSITY, Durham, NC (US); IonQ, Inc., College Park, MD (US)

( * ) Notice: Subject to any disclaimer, the term of this patent is extended or adjusted under 35 U.S.C. 154(b) by 67 days.

(21) Appl. No.: 17/589,231

(22) Filed: Jan. 31, 2022

(65) Prior Publication Data

US 2022/0156628 A1    May 19, 2022

Related U.S. Application Data

(62) Division of application No. 16/199,993, filed on Nov. 26, 2018, now Pat. No. 11,281,987.

(60) Provisional application No. 62/591,641, filed on Nov. 28, 2017.

(51) Int. Cl.
*G06N 10/00* (2022.01)
*G06F 8/41* (2018.01)
*G06F 30/00* (2020.01)

(52) U.S. Cl.
CPC ............. *G06N 10/00* (2019.01); *G06F 8/425* (2013.01); *G06F 30/00* (2020.01)

(58) Field of Classification Search
None
See application file for complete search history.

(56) References Cited

FOREIGN PATENT DOCUMENTS

| JP | 2006331249 | * | 12/2006 |
| JP | 2006331249 | A | 12/2006 |

OTHER PUBLICATIONS

Debnath et al. "Demonstration of a small programmable quantum computer with atomic qubits", https://arxiv.org/abs/1603.04512v3, Aug. 3, 2016, 10 pages.
International Written Opinion corresponding to International Application No. PCT/US2018/062553, dated Jan. 7, 2020.
International Search Report and Written corresponding to International Application No. PCT/US2018/062553, dated Feb. 20, 2019.

(Continued)

*Primary Examiner* — Matthew L Reames
(74) *Attorney, Agent, or Firm* — ARENTFOX SCHIFF LLP

(57) ABSTRACT

The disclosure describes various aspects of a software-defined quantum computer. For example, a method is described for generating an intermediate representation of source code for a software-defined quantum computer. The method includes performing a lexical analysis on a high-level intermediate representation of a quantum programming language; performing semantic analysis on an output of the lexical analysis; and generating a mid-level intermediate representation of the quantum programming language based on an output of the semantic analysis.

10 Claims, 13 Drawing Sheets

(56) References Cited

OTHER PUBLICATIONS

Allen, S, et al, "Reconfigurable and Programmable Ion Trap Quantum Computer", 2017 IEEE (3 pages).
Monroe, C, et al, "Large-scale modular quantum-computer architecture with atomic memory and photonic interconnects", American Physical Society, published Feb. 13, 2014, pp. 022317-022317-16 (16 pages).
Brown, K, et al, "Co-designing a scalable quantum computer with trapped atomic ions", NPJ Quantum Information< Nov. 8, 2016, pp. 1-10 (10 pages).
Ying, M, et al, "A Flowchart Language for Quantum Programming", IEEE Transactions on Software Engineering, vol. 38, No. 4, Jul./Aug. 2011, pp. 466-485 (20 pages).
"Compiler Design—Phases of Compiler", Tutorials Point website, URL <https://web.archive.org/web/20170909135519/https://tutorialspoint.com/compiler_design/compiler_design_phases_of_compiler.htm> (3 pages).
Notice of Reasons of Refusal issued in Japanese Patent Application No. 2020-528929, mailed Jan. 10, 2023.

* cited by examiner

SOFTWARE-DEFINED QUANTUM COMPUTER

CROSS REFERENCE TO RELATED APPLICATIONS

The present application is a divisional application of U.S. patent application Ser. No. 16/199,993, filed Nov. 26, 2018, which claims priority to and the benefit of U.S. Provisional Patent Application No. 62/591,641, filed on Nov. 28, 2017, and both entitled "SOFTWARE-DEFINED QUANTUM COMPUTER." The contents of each of these applications is incorporated herein by reference in their entireties.

BACKGROUND OF THE DISCLOSURE

Aspects of the present disclosure generally relate to configurable quantum computing systems, and more specifically, to a software-defined quantum computer.

In a conventional quantum computer (QC) for solid-state quantum bits or qubits (e.g., superconducting qubits, quantum dots (QDs), etc.), the qubits are fabricated in, and their connections are often limited by, the hardware design of the chip or integrated circuit. This means that, for instance (but not limited to), (i) the size of the problem that can be computed, (ii) the type of circuit operations or algorithms/computations that can be implemented, and (iii) the corresponding performance metrics (e.g., total number of gates needed to run the circuit/algorithm, time it takes perform computations, and the success probability for a quantum circuit) depend strongly on the detailed design of the qubit hardware (i.e., the hardware used to realize the quantum bits), which is often implemented as a chip or integrated circuit. In other words, the operation or configuration of a conventional solid-state quantum computer tends to be rigid by the inherent limitations of the hardware components.

Techniques that allow for flexibility and configurability, particularly dynamic and/or software-based configurability, of quantum computers are highly desirable.

SUMMARY OF THE DISCLOSURE

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its purpose is to present some concepts of one or more aspects in a simplified form as a prelude to the more detailed description that is presented later.

In an aspect of the disclosure, a hardware description language may be used with a software-defined quantum computer to configure the various resources available to the software-defined quantum computer to perform particular tasks, functions, programs, or routines. The hardware description language may be used to dynamically configure the software-defined quantum computer such that, for example, the size of the computations (e.g., the number of qubits) need not be fixed and may be adjusted on the fly. In an example, hardware description language may specify the structure (e.g., hardware connectivity) and behavior (e.g., operations) of the software-defined quantum computer.

In an aspect of the disclosure, a software-defined quantum computer is described that includes a control unit configured to receive programming instructions from a software program and generate control signals based at least in part on the programming instructions, and multiple qubits, where a number of the qubits and connections between any two of the qubits are enabled and controlled by the control signals from the control unit.

In another aspect of the disclosure, a software-defined quantum computer is described that includes multiple modules, each module having a control unit, a communication control unit, and multiple qubits, each control unit being configured to receive programming instructions from a software program and generate control signals based at least in part on the programming instructions, and a number of the qubits and connections between any two of the qubits are enabled and controlled by the control signals from the control unit. The software-defined quantum computer also includes a switch/router unit configured to enable communication channels from the communication control unit from each of the modules.

In another aspect of the disclosure, a software-defined quantum computing architecture is described that includes an application programming interface (API), a quantum operating system (OS) on which the API executes, the quantum OS including a resource manager and a switch, and multiple quantum cores connected via the switch, the resource manager being configured to determine the allocation of qubits in the quantum cores.

In another aspect of the disclosure, a method for compiling source code for a software-defined quantum computer is described that includes performing a lexical analysis on a high-level intermediate representation of a quantum programming language, performing semantic analysis on an output of the lexical analysis, and producing a mid-level intermediate representation of the quantum programming language based on an output of the semantic analysis.

In yet another aspect of the disclosure, a computer-readable medium storing code with instructions executable by a processor for compiling source code for a software-defined quantum computer is described that includes code for performing a lexical analysis on a high-level intermediate representation of a quantum programming language, code for performing semantic analysis on an output of the lexical analysis, and code for producing a mid-level intermediate representation of the quantum programming language based on an output of the semantic analysis.

In another aspect of the disclosure, a software-defined quantum computer is described that includes a first control unit and a second control unit. The first control unit can be configured to receive programming instructions from a software program and generate first control signals, and a first plurality of qubits is enabled and controlled by the first control signals from the first control unit. The second control unit can be configured to receive programming instructions from the software program and generate second control signals, and a second plurality of qubits is enabled and controlled by the second control signals from the second control unit. Moreover, the first control unit can be configured to shuttle a number of the first plurality of qubits to be controlled by the second control unit such that a number of the second plurality of qubits is increased by the number of the first plurality of qubits that are shuttled.

Described herein are methods, apparatuses, and computer-readable storage medium for various aspects associated with software-defined quantum computers.

BRIEF DESCRIPTION OF THE DRAWINGS

The appended drawings illustrate only some implementation and are therefore not to be considered limiting of scope.

DETAILED DESCRIPTION

Figure 1A:
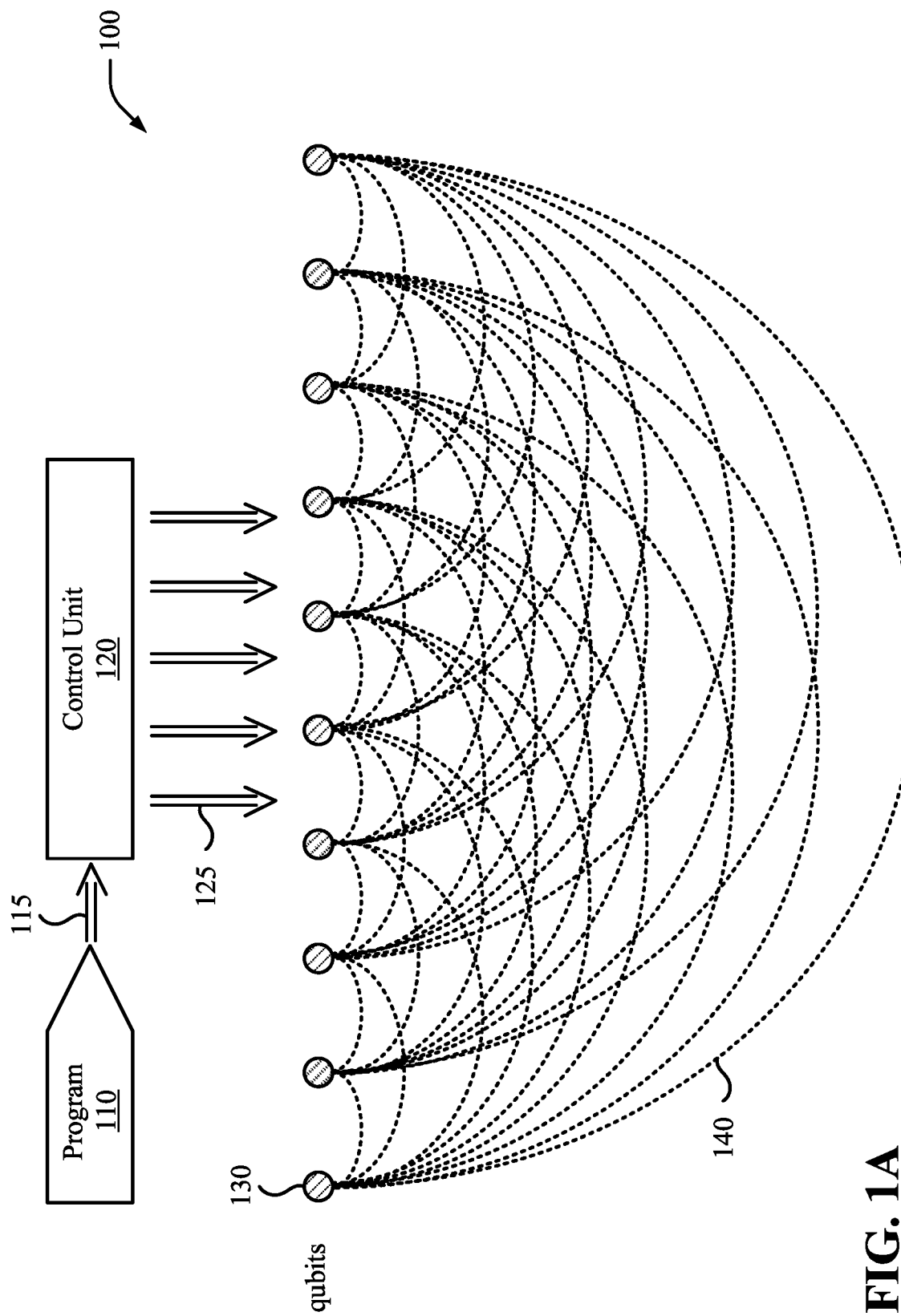
FIG. 1A is a diagram that illustrates an example of a software-defined quantum computer in accordance with aspects of this disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known components are shown in block diagram form in order to avoid obscuring such concepts.

This disclosure describes various aspects of an approach to implementing a quantum computer (QC), QC system, or quantum information processing (QIP) system, where several, if not most, of the functional aspects of the QC are defined by software (i.e., software-defined functionality). That is, the functionality of the QC need not be rigid or limited by the hardware design and can be configured using software. By implementing a software-defined architecture for a QC, it is possible to use software or some dynamic instructions to define a system of qubits, to control and manipulate qubit connectivity (e.g., connections between different qubits), and to modulate the inter-qubit interactions (e.g., interactions between different qubits) to execute a given computational or simulation task. This approach may also involve a systematic way to describe the hardware configurations for the QC.

A classical, that is, non-quantum, central processing unit (CPU) typically consists of a control unit and a datapath, both of which are typically implemented using digital complementary metal-oxide-semiconductor (CMOS) circuitry. The control unit typically translates the program's instructions to decide how to manipulate the data, and manages the resources in the CPU necessary for the execution of the instruction, as well as the timing of each instruction execution. The datapath is a collection of functional units, registers, and buses in the processor where the data being processed flow through. The computation is carried out by the control unit instructing the various functional units, registers, and buses to manipulate the data, resulting in the final output of the desired computational task. In a typical CPU, the control unit and the datapath are implemented using digital circuits constructed using logic elements, built using transistors, and are highly intertwined in its layout on the chip.

A quantum computer (or QC/QIP system) manipulates quantum data (measured in units of qubits), and therefore the datapath has to be made up of quantum objects. The functional units that store, transport, and manipulate the data must be able to handle the qubits, maintaining quantum characteristics (such as superposition and entanglement) and acting simultaneously on all components of the superposition input states. On the other hand, the control unit is typically classical, as the instructions specified in the control program are classical in nature. A typical control unit can be configured to translate an instruction from a program or algorithm into a classical control signal that operates the functional units to act on the qubits to effect the desired data manipulation. The action on the qubit is generally analog in nature, where the classical control signal (typically consists of a carrier electromagnetic field (e.g., radio frequency (RF), microwave, optical) with modulation that encodes the action in either the same or a separate field) transforms the qubit (or a group of qubits) to a different quantum state via controlled time-evolution of quantum systems. That is, the classical control signal is used to control operations that sequentially transform the qubit states over time to generate the desired computation or simulation.

In this disclosure, the implementation of a quantum computer (or QC/QIP system) is considered where the control units are specifically designed and constructed in the hardware, while leaving the physical implementation of the datapath fully flexible and reconfigurable. The physical implementation of the datapath is described by a set of instructions provided to the hardware units, rather than being pre-designed and fabricated in the hardware. Likewise, the interaction among the qubit datapaths are also implemented as a sequence of instructions that enacts the time evolution of the qubit systems, dictated by the control signal generated by the control unit using a software program.

The approach described in this disclosure has some unique features that distinguish this approach from earlier approaches. For a QC based on trapped ion technology, for example, the unique features of the proposed system are described below. Trapped ion technology may refer to the use of ions or atoms loaded and arranged into a trap or similar structure to control their states in order to perform quantum operations/simulations.

In a first aspect, the number and connectivity (e.g., interactions) of the qubits in the system is not predetermined by the design of the hardware. For example, the QC can have a control unit with the capability to control n qubits at a time (e.g., n is an integer and could be 16, 32, 64 or something larger) in the hardware (control unit) design, and then "load" anywhere between 1 and m qubits (e.g., where m is also an integer and can potentially be much larger than n) each time we choose to operate the QC.

FIG. 1A shows a diagram 100 that illustrates an example of a software-defined quantum computer in accordance with aspects of this disclosure. The system shown in the diagram 100 of FIG. 1A can, as described above, load or enable up tom qubits and then control any subset of n qubits (see e.g., qubits 130 in FIG. 1A), where m≥n. As used herein, the terms quantum computer, quantum computer system, quantum computing system, an quantum information processing system may be used interchangeably.

As noted above, a hardware description language may be used with a software-defined quantum computer to configure the various resources available to the software-defined quantum computer so that it can perform particular tasks, functions, programs, or routines. The hardware description language may be used to dynamically configure the software-defined quantum computer such that, for example, the size of the computations (e.g., the number of qubits) may be adjusted on the fly (e.g., can be changed from one size to another size at any point in time). In an example, hardware description language may specify the structure and behavior of the software-defined quantum computer. This approach differs from a conventional quantum computer in which the configuration is rigid and fixed by the hardware. Instead, a software-defined quantum computer may be configured using, for example, a hardware description language (or quantum hardware description language), in a manner similar to how a field programmable device may be configured. As such, a software-defined quantum computer may be configured to load and use 10 qubits, 20 qubits, or 100 qubits (or any number for that matter) as it is needed for the particular operations being performed.

In a second aspect, the qubits have available all-to-all interaction among them, where such form of interaction may be normally off. In other words, each qubit may interact or have some connectivity (see e.g., connections or interactions 140 in FIG. 1A) to a subset of the remaining qubits (including a single other qubit) or to all of the remaining qubits. Some of the interactions among the qubits can be "turned on" or enabled by a control unit (see e.g., control unit 120 in FIG. 1A) to affect certain instructions (e.g., a set of logic gates) on a set of qubits. The nature of each instruction may be determined by the way the control unit is programmed (e.g., by program 110 using programming instructions 115), to generate the necessary control signals (see e.g., control signals 125) to perform the instruction(s). The programming instructions 115 provided by the program 110 may therefore reflect the set of instructions and the control unit 120 may process the programming instructions 115 to generate the appropriate control signals 125 to perform the set of instructions.

In another aspect, in one implementation, the set of instructions can be described as a collection of algebraic quantum gates with each gate performing a discrete action on a quantum input of qubits to generate an output state of the qubits.

In another aspect, in another implementation, the set of instructions can be described as a collection of parameterized, continuous quantum gates, broadly defined, with each gate performing a parameter-dependent action on a quantum input. For example, a predetermined evolution of a set of qubits in the QC associated with desired interaction Hamiltonian is implemented with continuous variables that dictate the nature of evolution.

In yet another aspect, the time evolution of the set of qubits used can be adiabatic (e.g., adiabatic time evolution), diabatic (e.g., diabatic time evolution), or anything in between (e.g., adiabatic/diabatic or mixed time evolution), as long as they are well-defined.

In yet another aspect, in another implementation, the set of instructions can be a combination of quantum logic gates and Hamiltonian evolution. The combination may be temporal, spatial, or both.

In another aspect, an expanded or expandable system can also be considered as part of the type of software-defined quantum computers described in this disclosure. The overall, composite system may be constructed with a group of individual, component qubit systems, where the quantum connection among the constituent qubit systems are established by either shared entanglement among a subset of constituent qubit systems, or by physically moving the qubits between the constituent qubit systems.

Figure 1B:
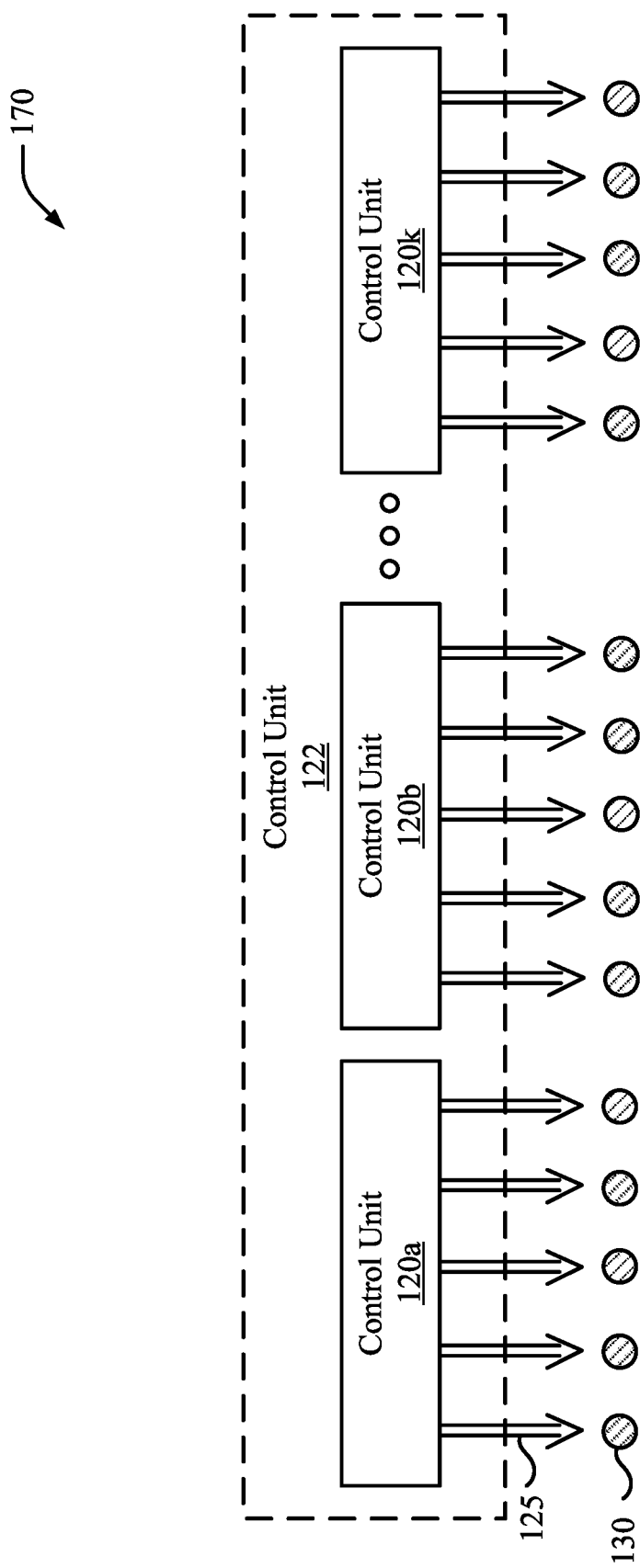
FIGS. 1B-1D are diagrams that illustrate examples of controlling multiple regions of quantum bits (qubits) in accordance with aspects of this disclosure.
Figure 2:
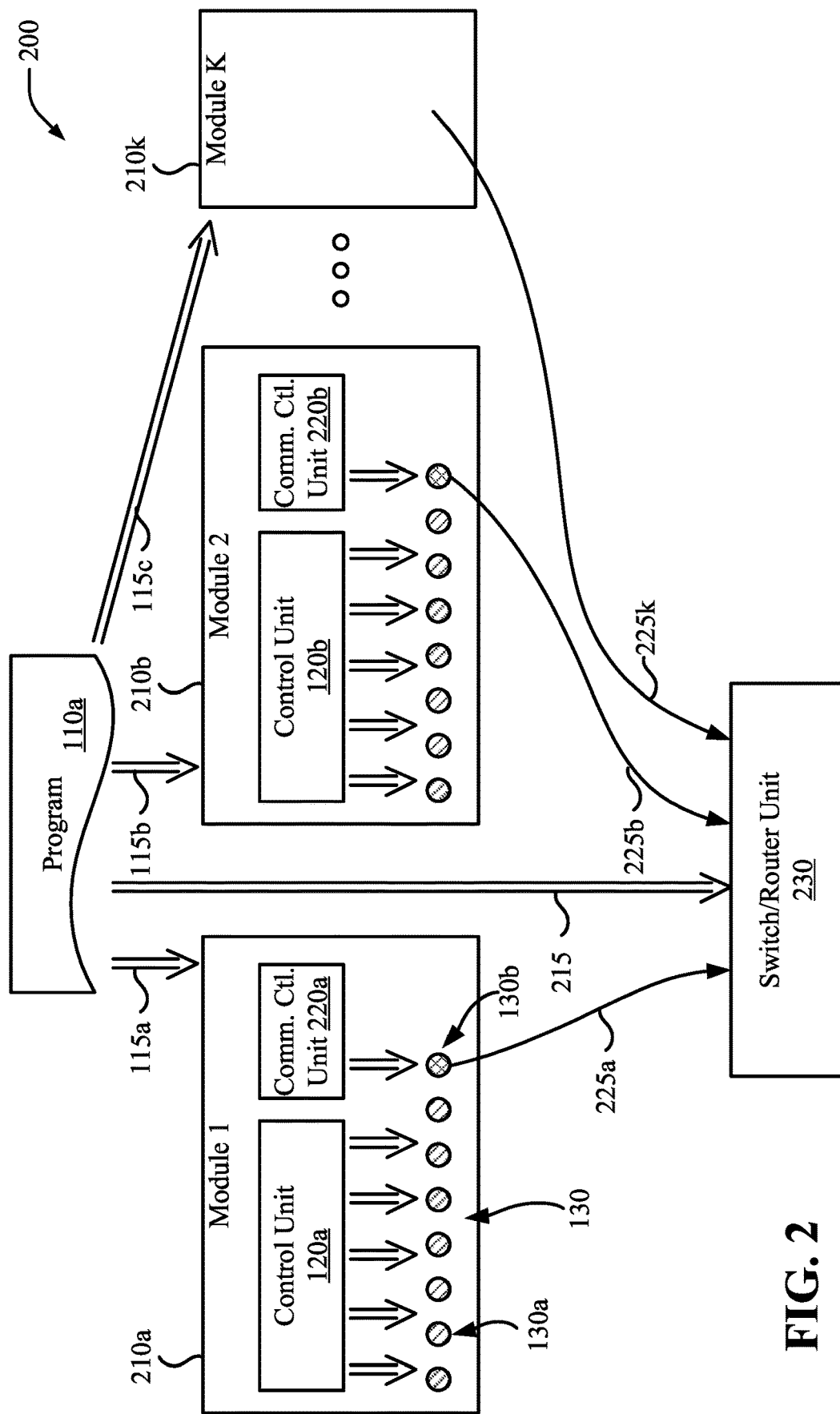
FIG. 2 is a diagram that illustrates an example of an expandable software-defined quantum computer in accordance with aspects of this disclosure.

FIG. 1B shows a diagram 170 that illustrates an example of a control unit 122. The single control unit 122 in diagram 170 can represent the implementation of several of the control units 120 in FIG. 1A. These multiple control units 120, while physically and/or logically separate from each other, may be organized or implemented within a higher level structure, in this case the single control unit 122. For example, in diagram 170, the control unit 122 includes control units 120a, 120b, . . . , 120k, which may also be referred to as sub-control units or sub-units to the control unit 122. In this example, each of the control units 120a, 120b, . . . , 120k can process a subset of the programming instructions 115 received by the control unit 122 or can receive its own, separate set of programming instructions 115. FIG. 2, which shows an expandable software-defined quantum computer and is described in more detail below, illustrates a case in which more than one control unit 120 is used, where these control units 120 may be separately implemented.

Each of the control units 120a, 120b, . . . , 120k is independently programmable and can be used to control (e.g., using control signals 125) a distinct set of qubits (e.g., qubits 130). The number of qubits can be the same for all of the control units or can vary across control units, depending on the programming instructions received and the maximum number of qubits that can be loaded or enabled by a respective one of the control units 120a, 120b, . . . , 120k.

In another aspect, when the qubits are implemented using ion trap technology, each of the control units 120a, 120b, . . . , 120k handles qubits in a different region of the ion trap. It is possible then to expand a software-defined quantum computer by how these control units are used in connection with adjacent regions in an ion trap.

Figure 1C:
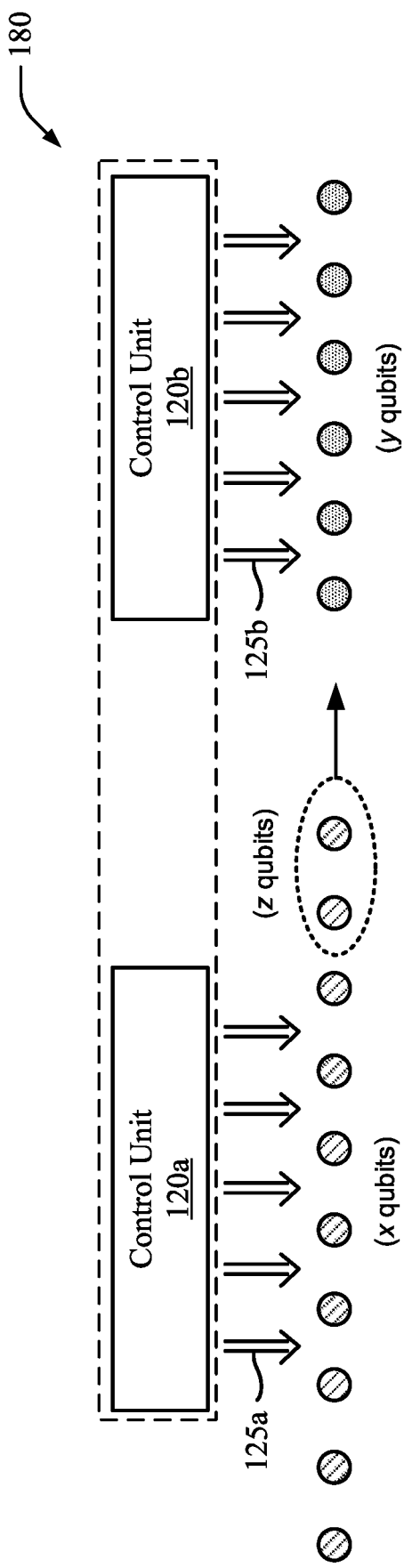
Figure 1D:
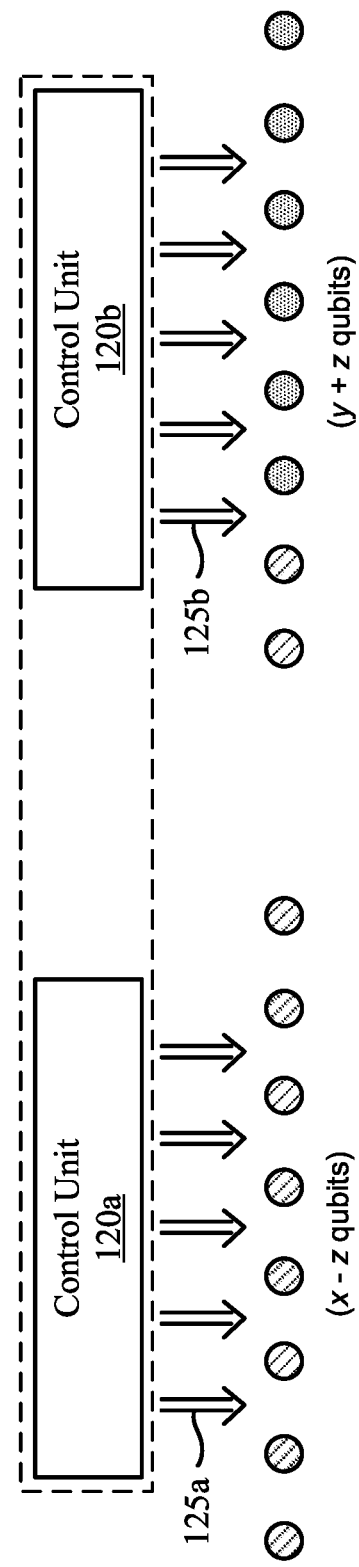

FIGS. 1C and 1D show diagrams 180 and 190, respectively, to illustrate the "shuttling" of ions or atoms between different control units (e.g., between different regions in an ion trap). For example, in diagram 180, the control unit 120a controls x qubits (e.g., ions or atoms) and the control unit 120b controls y qubits (e.g., ions or atoms). The dashed line indicates that while the control unit 120a and the control unit 120 are shown as separate devices, they may be optionally implemented monolithically as part of a same structure (e.g., control unit 122 in FIG. 1B).

Diagram 190 shows the "shuttling" or transfer of z qubits from the qubits controlled by the control unit 120a to the qubits controlled by the control unit 120b. As a result of this process, the control unit 120a is left controlling (x−z) qubits and the control unit 120b is left controlling (y+z) qubits. In one example, if both control units initially handled thirty (30) ions or atoms, and five (5) ions or atoms are shuttled or transferred over, then the control unit 120b is left controlling or handling thirty five (35) ions or atoms and the control unit 120a s left controlling or handling twenty five (25) ions or atoms. These shuttled or transferred ions or atoms can be used to communicate information from one set of qubits to another set of qubits.

Based on the additional aspects described in FIGS. 1B-1D, a software-defined quantum computer (e.g., such as a variation of the software-defined quantum computer 100 in FIG. 1A), can include a first control unit (e.g., control unit 120a) and a second control unit (e.g., control unit 120b), where the first control unit is configured to receive programming instructions (e.g., programming instructions 115) from a software program and generate first control signals (e.g., control signals 125a), and a first plurality of qubits is enabled and controlled (e.g., x qubits) by the first control signals from the first control unit, and where the second control unit is configured to receive programming instructions from the software program and generate second control signals, (e.g., control signals 125b) and a second plurality of qubits is enabled and controlled (e.g., y qubits) by the second control signals from the second control unit. In such a quantum computer, a number of control units including the first control unit and the second control unit can be dynamically changed (e.g., increased or decreased based on the number of qubits needed and the number of control units needed to control those qubits).

The first control unit is further configured to shuttle a number of the first plurality of qubits (e.g., z qubits) to be controlled by the second control unit such that a number of the second plurality of qubits is increased by the number of the first plurality of qubits that are shuttled (e.g., y+z qubits). A number of qubits that remain under the control of the first control unit are reduced by the amount of qubits shuttled over (e.g., x−z qubits).

The programming instructions received by the first control unit may be different than the programming instructions received by the second control unit. The programming instructions received by the first control unit include communication instructions to shuttle the number of the first plurality of qubits to be controlled by the second control unit.

In another aspect, the number of the first plurality of qubits that are shuttled includes information associated with the first plurality of qubits, and the information is transferred to the second plurality of qubits by the number of the first plurality of qubits that are shuttled. The number of the first plurality of qubits shuttled to be controlled by the second control unit includes one or more qubits and the shuttling of the one or more qubits establishes a communications channel between the first plurality of qubits and the second plurality of qubits.

In another aspect, the first plurality of qubits includes memory/operations qubits (see e.g., memory/operations qubits 130a in FIG. 2) and communications qubits (see e.g., communications qubits 130b in FIG. 2) that are enabled and controlled by the control signals from the first control unit, and the number of the first plurality of qubits that are shuttled includes one or more of the communication qubits.

It is possible to expand the capabilities of a software-defined quantum computer through the techniques described above in connection with FIGS. 1A-1D by adjusting the number of ions or atoms and the number of control units needed to control the ions or atoms. An example of such expanded capabilities is described in more detail below in FIG. 2.

FIG. 2 shows a diagram 200 that illustrates an example of an expandable software-defined quantum computer or quantum computing system in accordance with aspects of this disclosure. The expandable quantum computing system shown in diagram 200 in FIG. 2 follows some of the architectural aspects of the system shown in diagram 100 in FIG. 1A and in FIGS. 1B-1D. For example, the system in diagram 200 includes a program 110a that provides programming instructions 115a to a module 210a (Module 1) having a control unit 120a and a communication control unit 220a (referred to as Comm. Ctl. Unit 220a in FIG. 2). The programming instructions 115a may be used to program the control unit 120a to affect a set of instructions on one or more of the qubits that have been loaded within the module 210a via control signals produced by the control unit 120a. Moreover, the programming instructions 115a may be used to program the communication control unit 220a to affect a set of instructions on one or more of the qubits via control signals produced by the communication control unit 220a to enable, implement, or control a communication channel 225a with a switch/router unit 230.

The program 110a may also provide programming instructions 115b to a module 210b (Module 2) configured to include a control unit 120b and a communication control unit 220b (referred to as Comm. Ctl. Unit 220a in FIG. 2), which in turn can enable, implement, or control a communication channel 225b with the switch/router unit 230. As shown in the diagram 200, the number of modules used in the system is configurable or expandable and there could be up to k modules, where a module 210k (Module K) can also include a control unit and a communication control unit (in addition to multiple internal qubits) and a communication channel 225k may be enabled between the module 210k and the switch/router unit 230. The switch/router unit 230 is configured to provide connectivity between the different modules via the interactions between the modules and the switch/router unit 230.

The communication control units 220a and 220b in FIG. 2 may be implemented independent from their respective control units 120a and 120b, or may be integrated within their respective control units 120a and 120b. The communication achieved using the communication control units 220a and 220b as well as the switch/router unit 230, may also be accomplished or realized, at least in part, using the shuttling technique described in FIGS. 1C and 1D in which information from one set of qubits is available to another set of qubits as a result of the shuttling of qubits.

Within each of the modules 210a, . . . , 210k there are a number of qubits 130 that can be controlled by the respective control unit and communication control unit. Some of the qubits may be used for memory/operations (e.g., qubits 130a) and others may be communications qubits used to enable the communications channels 225 (e.g., qubits 130b). When the qubits 130 in a module are implemented using ion-trapped technology, for example, the memory/operation qubits 130a can be based on $^{171}Yb^+$ atomic ions, and the communication qubits 130b can be based on $^{138}Ba^+$ atomic ions. Other species and/or isotopes can also be used for the pairs of memory/operations and communications qubits. The memory/operations qubits 130a are enabled and controlled by the control signals from the respective control unit, and the communication qubits 130b are enabled and controlled by the control signals from the respective communication control unit.

In another aspect, the specific instance of the hardware configuration (e.g., hardware configurations for the systems described in FIGS. 1A-1D and 2) may be provided using a quantum version of a hardware description language (HDL), that captures the key resources in each hardware (or set of qubits) instantiation, their availability and relative connection, and low-level functionality of the quantum hardware enabled by the configuration. It will also have an interface to which the quantum program generated by the higher-level software will control the operation of the hardware (see e.g., programs 110, 110a and control units 120, 120a, 120b).

In yet another aspect, the approach described in this disclosure also ensures a maximum portability of quantum programs (e.g., programs or instructions that are to be effected using a QC or QC system), because using a software-defined architecture allows for code independence from the underlying details of the hardware specifics of a QC or QC system. That is, the programs 110 and 110*a* in FIGS. 1A and 2, respectively, can be ported.

In another aspect, the flexibility of the approach described in this disclosure allows the use of optimized graph placement and the embedding of algorithms using both heuristics (e.g., a custom tabu search (TS)) and deep learning to port programs among different software-defined architectures. Using a custom tabu search for heuristics may involve using a global optimization algorithm and a metaheuristic or meta-strategy for controlling an embedded heuristic technique.

In another aspect, the approach described in this disclosure enables verification of the porting of a program to a software-defined architecture using both formal and algorithmic approaches.

In another aspect, this disclosure also describes the implementation of a resource manager (see e.g., resource manager 330 in a diagram 300 in FIG. 3) to deliver the most efficient software-defined architecture for an incoming job. The optimization is done over the following parameters:

(a) A software-defined architecture has two aspects: variable number of qubits and variable connectivity. The resource manager may be configured to capture both aspects while optimizing resources for a requested architecture.

(b) The optimality of the alignment of the ions with the 32 hard wired channels or interactions when the number of ions is less than 32 (e.g., for ion-trapped QC systems). Finding the right alignment may be trivial. For n ions, where n<32, there are 33−n ways to align the ions. It is assumed that the cost of all these alignments should be same but a better understanding of the cost may be available once the system starts calibrating. The resource manager described above is configured to provide optimization if there is a non-trivial cost function.

(c) It is possible to gain on the computation time of a waveform (e.g., an analog control signal) if there are fewer qubits, which goes in favor of using a software-defined architecture in which the number of qubits used can be dynamically configured. That is, the variability or configurability in the number of qubits provides a benefit on the hardware side of a software-defined QC.

(d) The variability in the connectivity will provide benefits on the software side by, for example, allowing the building of a robust application programming interface (API) stack. There may also be benefits on the hardware side although the current system can inherently have a restricted graph.

In yet another aspect, the software-defined QC approach described in this disclosure may also adapt the concept of elasticity from cloud computing. For example, it is possible to implement an elastic computing environment where qubits can be shuttled from a reserve region (already loaded in a separate trapping zone) to the computing region and back on demand during the runtime of a program. That is, the demands placed on the system during runtime of a program may be used to dynamically modify (e.g., provide elasticity to) the computing environment. Therefore, it is possible to have readily available zones in a trap with additional computing resources (e.g., preloaded ions) to easily expand the computing environment on demand.

In another aspect, the architectures described herein for software-defined QCs and QC/QIP systems may support both homogenous and heterogeneous multi-core quantum processing unit (QPU) systems. A homogenous multi-core QPU is a network of identical traps (e.g., ion traps). On the other hand, a heterogeneous multi-core QPU is a network of traps of different configurations, or a network of QPUs constructed using disparate technologies (e.g., ion traps, superconducting circuits, etc.).

For heterogeneous multi-core QPU networks having disparate technologies may require the use of transducers (e.g., quantum transducers) to connect qubits of different physical systems. In one implementation, a single transducer may be used between two qubits of different technologies. In another implementation, different transducers may be used based on the direction of the connection or interaction (e.g., a first transducer in a direction from a qubit 1 to a qubit 2, and a second transducer in a direction from the qubit 2 to the qubit 1).

Various aspects of the software-defined QC and QC/IP systems described in connection with this disclosure include aspects associated with the architecture, implementation, configuration, and optimization, including but not limited to architecture graph, circuit graph, portability, quadratic assignment problem, depth optimal layout, sequence of (heuristic) optimal embedding, single-instruction multiple-data (SIMD) QC, quantum circuit compilation, quantum circuit design, and quantum circuit optimization.

Figure 3:
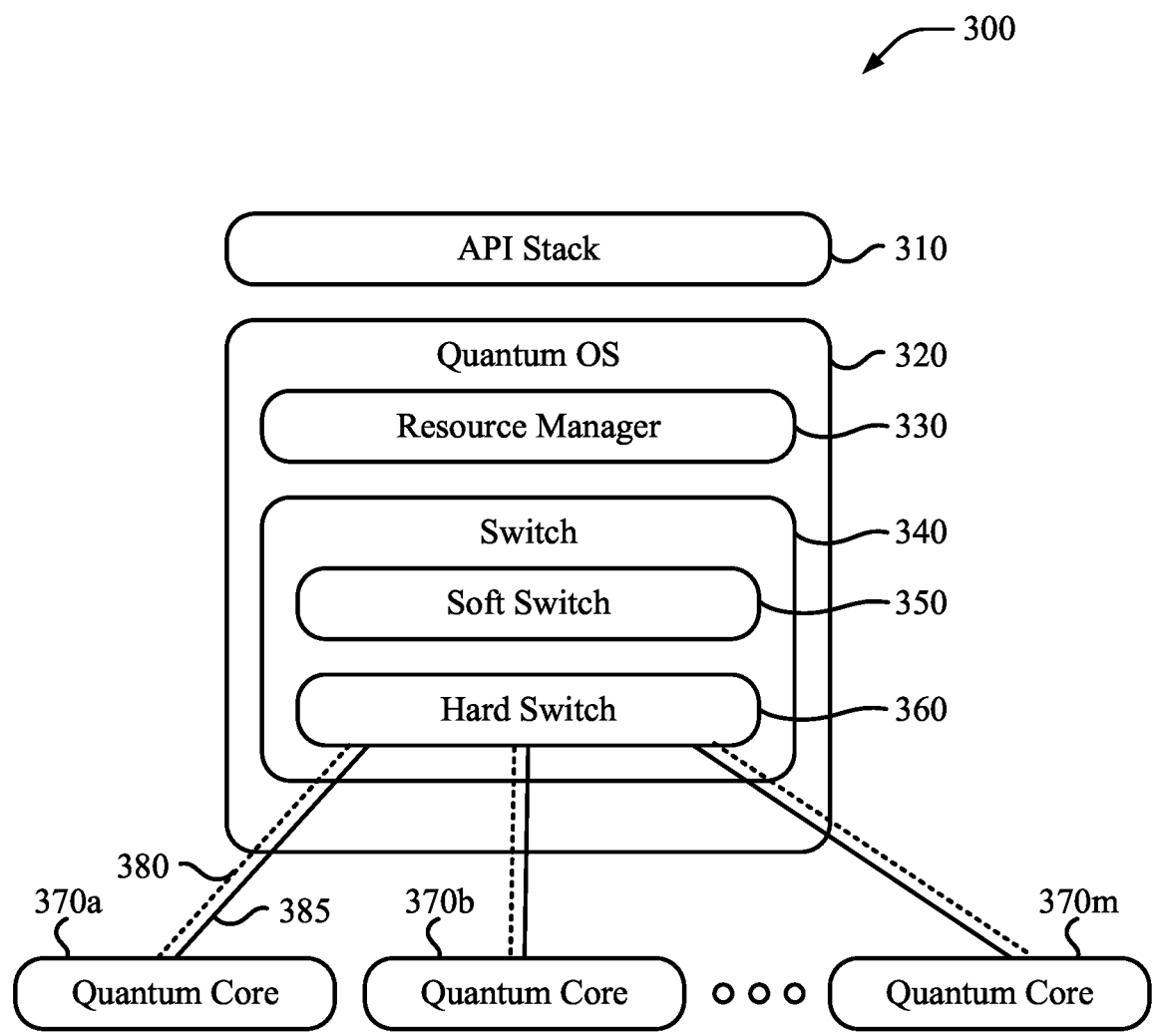
FIG. 3 is a diagram that illustrates an example of a software-defined quantum computer architecture in accordance with aspects of this disclosure.

FIG. 3 shows the diagram 300 that illustrates an example of a system architecture for a software-defined QC in accordance with aspects of this disclosure. The system architecture shown in the diagram 300 is based on ion traps or ion trap technology, and is provided by way of example and not of limitation. Systems based on technologies different from ion trap technology (e.g., trapped neutral atoms or superconducting circuits) may also be implemented using the techniques described in connection with diagram 300 in FIG. 3.

A software-defined quantum computer may generally include three major architectural layers. At the very top lies the API stack 310, which is configured to expose a programmable interface for the computer's users. Typically, the API stack 310 does not expose the hardware variability and assumes a virtual large completely connected quantum computer. That is, the manner in which the hardware is configured need not be known to the computer's users.

The Quantum Operating System (OS or QOS) 320 sits between the hardware and the API stack 310. The primitives of software-defined quantum architecture may be exposed and programmable inside this layer. The Quantum OS 320 may include a resource manager 330 (described at least partially above) to find an optimized way to handle qubit allocation. That is, the role of the resource manager 330 is to identify the most efficient software-defined architecture for an incoming job. A qubit allocation can be intra or inter quantum core (see e.g., quantum cores 370*a*, 370*b*, and 370*m*). A quantum core may also be referred to as a quantum unit, a core unit, or simply a core. As used in this disclosure unless otherwise specified, a quantum core may mean, for example, an individual ion trap (although quantum cores of other technologies may also be used). It is understood that an individual ion trap may include one or more qubits. If the core units in a network or architecture are not identical, the architecture is referred to as a heterogeneous architecture (this could mean different ion traps, or different cores made of different technologies, such as ion traps and trapped neutral atoms, or superconducting qubits). On the other hand, when a network or architecture has identical core units (e.g., identical ion traps), the architecture is referred to as a homogenous architecture. The resource manager 330 is configured to decide or determine how the qubits will be allocated and aligned inside a core unit (e.g., ion trap). The resource manager 330 is also configured to determine the best qubit connection (e.g., interactions 140) and communication channel (e.g., communication channels 225) (photonic interconnect, for example) for qubit allocation over multiple core units (e.g., traps). After the mapping is determined by the resource manager 330, a switch 340 inside the Quantum OS 320 may route all the operations and readouts. The switch 340 may include a soft switch 350 and a hard switch 360 that can have classical channels 380 (dotted line) and quantum channels 385 (solid line) connected to the quantum cores.

Figure 4A:
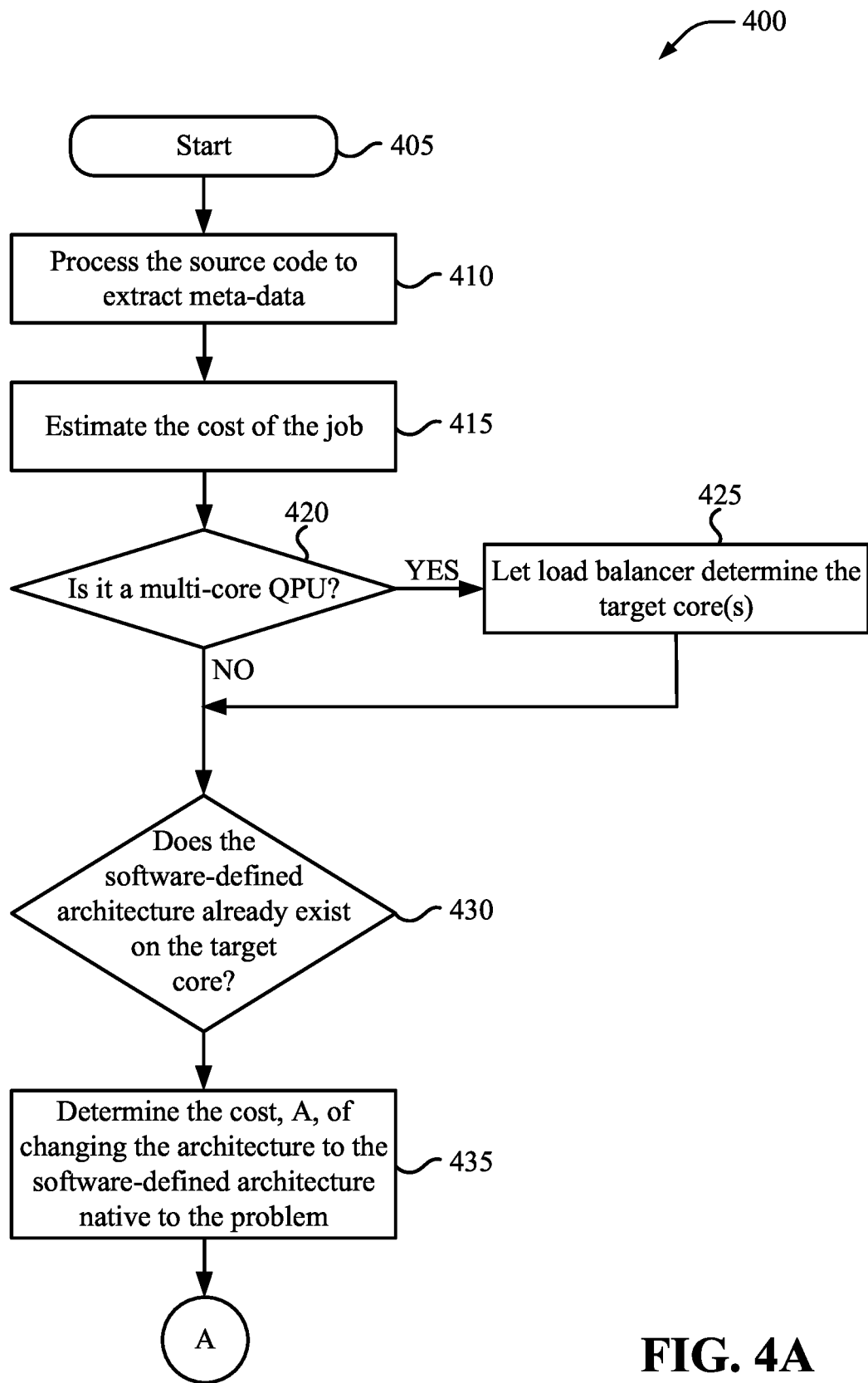
FIGS. 4A-4C is a flow chart that illustrates an example of a resource manager workflow in accordance with aspects of this disclosure.
Figure 4B:
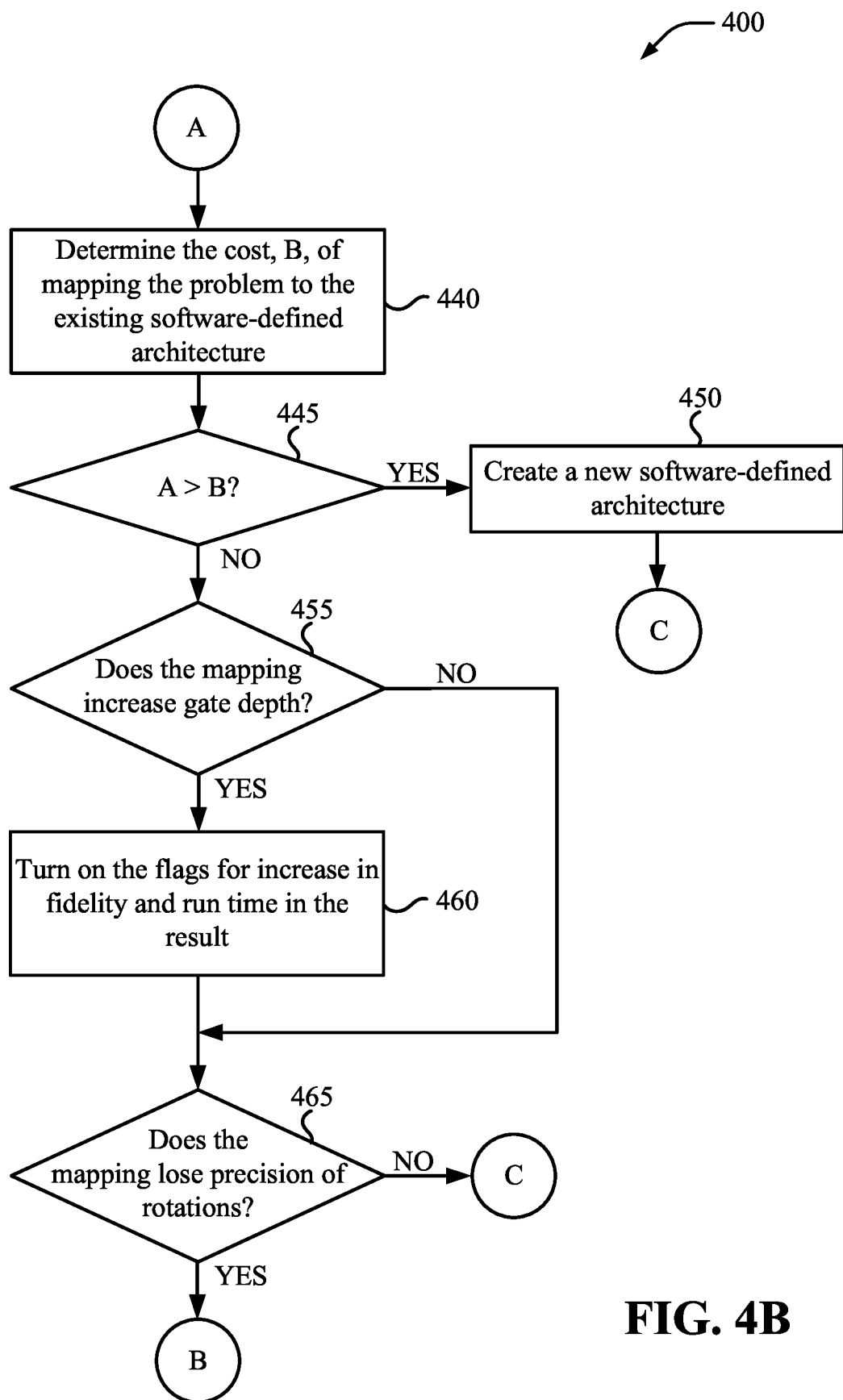
Figure 4C:
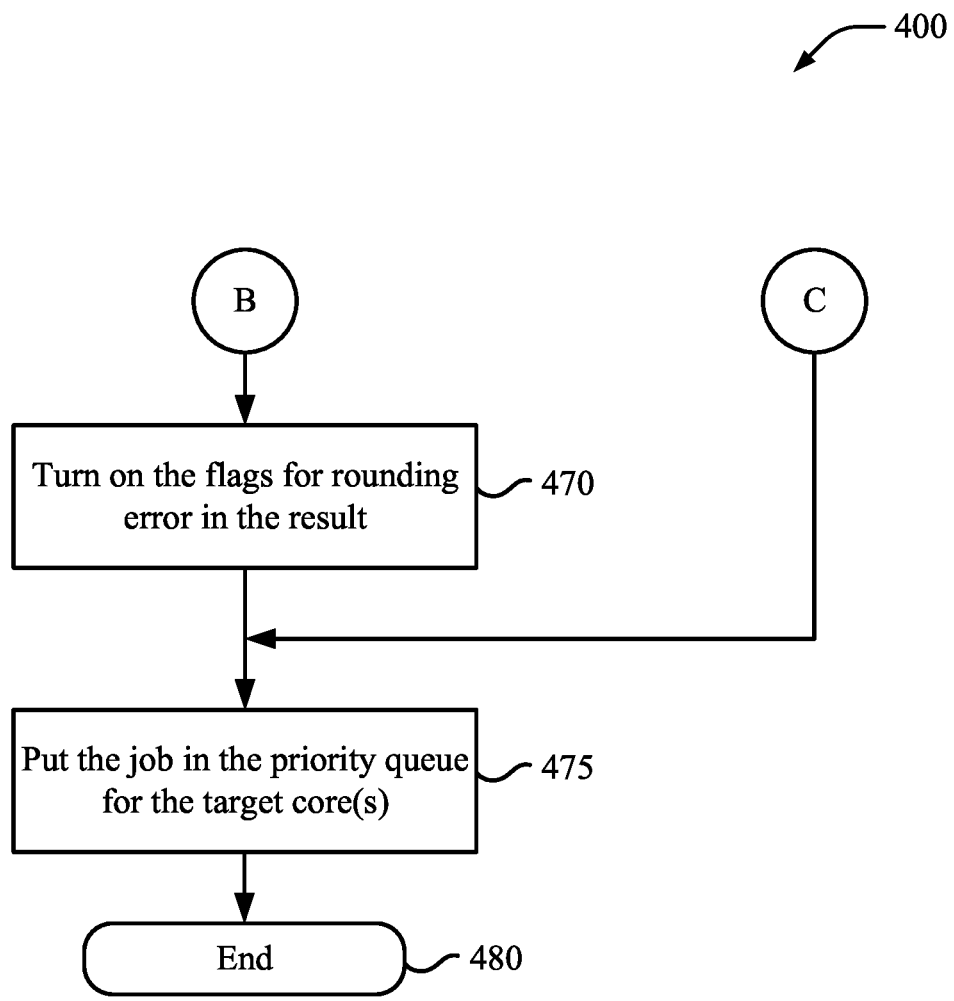

In another aspect of resource allocation in software-defined quantum architectures, FIGS. 4A-4C show a flow chart 400 that illustrates an example of a resource manager workflow in accordance with aspects of this disclosure.

There are many different kinds of resources at the disposal of a resource manager (e.g., resource manager 330) in a software-defined quantum architecture. These resources include qubits, connectivity, coherence, (photonic) interconnect network among core units (e.g., ion traps), classical communication channels, as well as other types of resources. A software-defined quantum architecture, via a resource manager, needs to optimize the resource utilization as much as possible within a reasonable time frame. When a program (e.g., a set of instructions) is submitted via the API stack 310 (see 405), it is translated into a next level intermediate representation which is handed over to the resource manager (see 410). From the netlist-like representation, the resource manager estimates the cost of executing the program (see 415). This cost will be used by the resource manager to make decisions about resource allocation. The first decision taken by the resource manager is whether hardware has the necessary and sufficient resources to execute the program (see 420). If it is a multi-quantum-core system, the resource manager allocates the least number of cores on which the program can run (see 425). If there are more than one set of least number of cores, the resource manager chooses the cores for which distribution of the program is least expensive. For example, the current requested operation is following a sequence of previous operations which have been performed on a certain software-defined architecture (see 430). The resource manager may compare between the cost of mapping the operation on an existing software-defined architecture (see 440) and the cost of creating a software-defined architecture native to the operation (see 435) and decide accordingly (see 445, 450). If any decision increases the circuit depth (see 455) or if a rounding off error occurs (see 465), the appropriate flags (see 460, 470) need to be raised while returning the result. The job may then be placed on the priority queue for the target core(s) (see 475).

Figure 5:
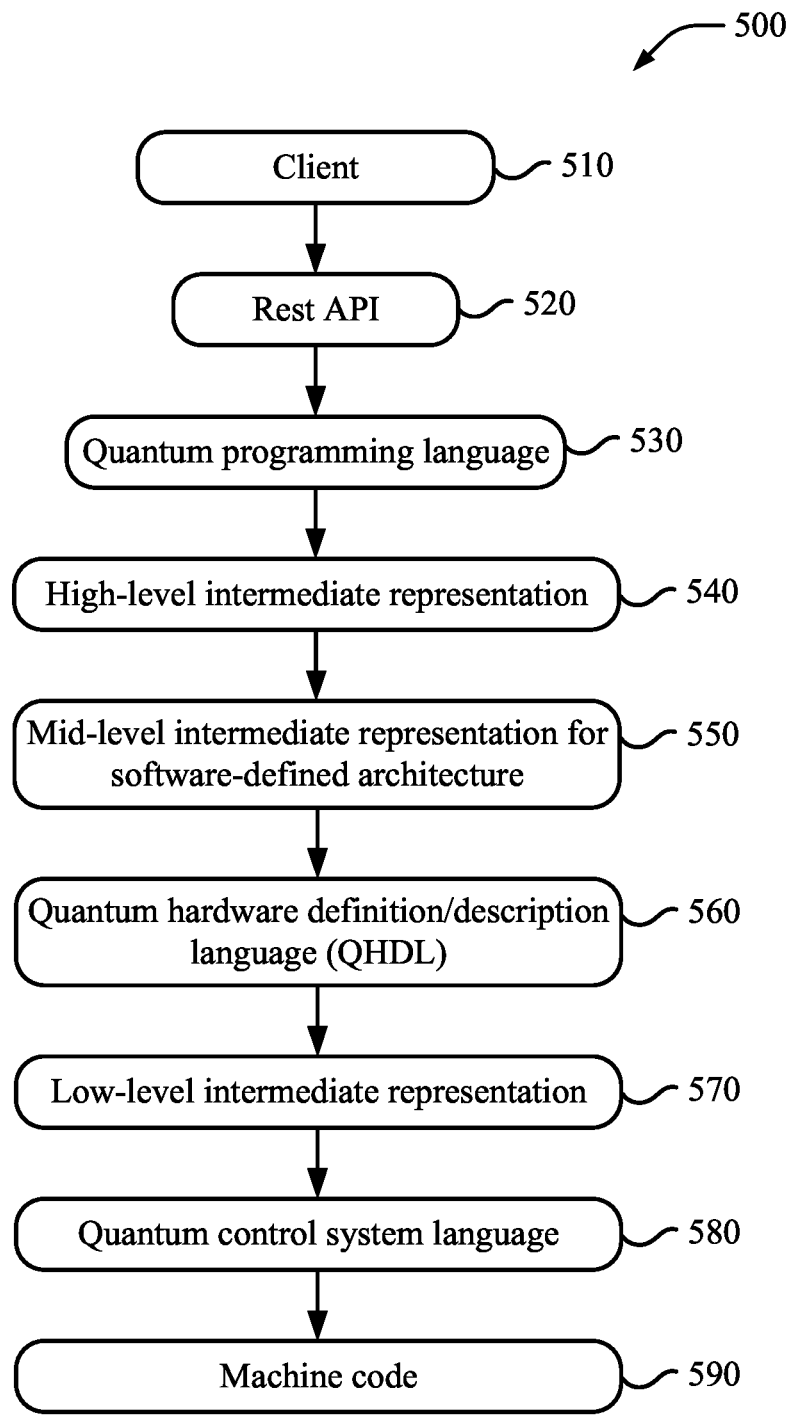
FIG. 5 is a chart that illustrates an example of levels of application programming interface (API) access points in accordance with aspects of this disclosure.

Another aspect associated with the software-defined quantum computer architectures described in this disclosure is the need for compiling quantum programs. Referring to FIG. 5, there is shown a chart 500 that illustrates an example of levels of API access points in accordance with aspects of this disclosure. The chart 500 shows as the top level, a client 510, followed by a rest API 520, a quantum programming language (QPL) 530, a high-level intermediate representation (HLIR) 540, a mid-level intermediate representation (MLIR) 550 for software-defined architecture, a quantum hardware definition or description language (HDL) 560, a low-level intermediate representation (LLIR) 570, a quantum control system language 580, and machine code 590 as the lowest level.

In an ideal system implementation, the software-defined quantum architecture may not be exposed via the highest level API (e.g., rest API 520). A code written using QPL (e.g., QPL 530) may be translated into a high level intermediate representation (540) which may still assume an idealized quantum architecture. An interpreter, which has access to the language primitives for software-defined quantum architecture, may translate the code into a mid-level intermediate representation (550). This mid-level representation may then be translated into a quantum version of hardware description language (HDL) or quantum HDL (QHDL) (560). A robust type system is needed to limit the propagation of programmer's error from the high-level intermediate representation to the mid-level intermediate representation for software-defined architecture. The development of the robust type system may be accomplished through the application of type theory. Standard languages of logic for these application are Floyd-Hoare logic and intuitionistic type theory. While it may be natural to use Floyd-Hoare logic for an imperative mid-level intermediate representation, one can be benefited from the usage of intuitionistic type theory if the representation has functional elements for distributed quantum computers. As noted above, after the use of QHDL, a low-level intermediate representation (570), a quantum control system language (580), and machine code (590) may be obtained or applied.

Figure 6:
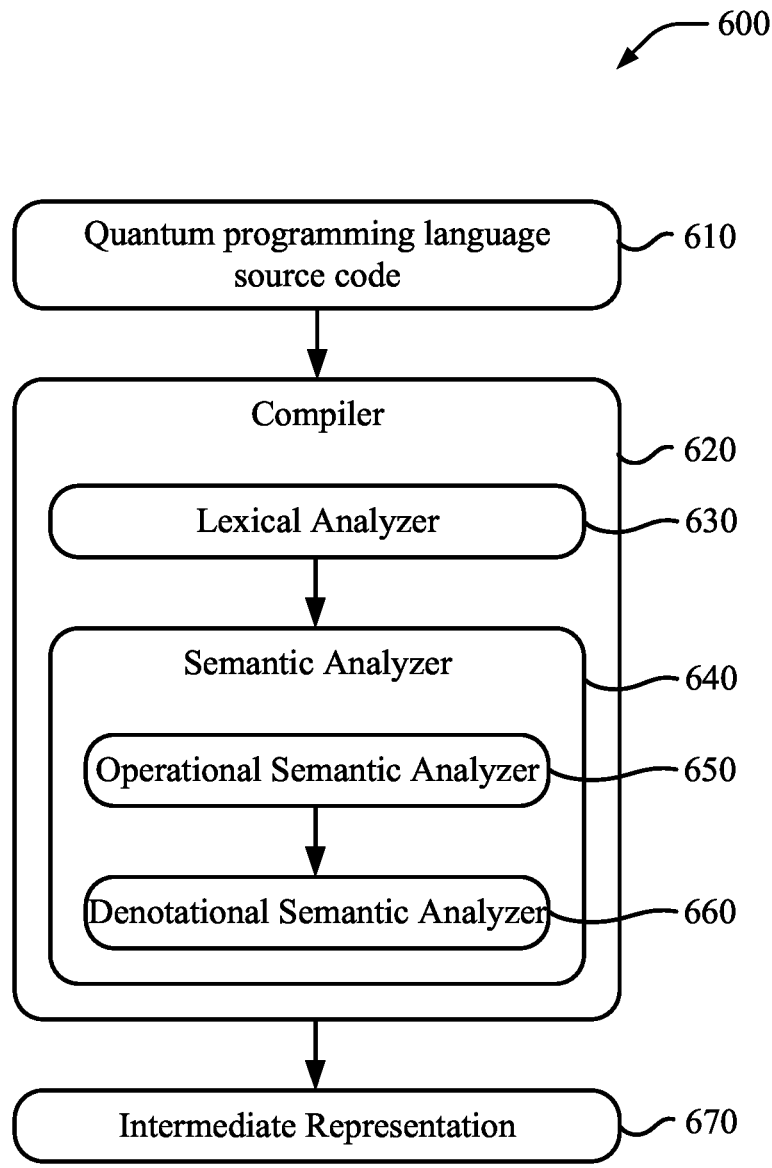
FIG. 6 is a diagram that illustrates an example of a compiler architecture in accordance with aspects of this disclosure.

Further with respect to the compilation of quantum programs, FIG. 6 shows a diagram 600 illustrating an example of typical components of a quantum compiler in accordance with aspects of this disclosure. As shown in diagram 600, a quantum compiler 620 receives quantum programming language source code 610. The quantum compiler 620 includes a lexical analyzer 630 and a semantic analyzer 640, which in turn has an operational semantic analyzer 650 and a denotational semantic analyzer 660. The output of the quantum compiler 620 is an intermediate representation 670.

In the case of software-defined architecture, a variant of the quantum compiler 620 is used to translate high-level intermediate representation (HLIR) of the source code (610) to a mid-level intermediate representation (MLIR) (670). The HLIR goes through the lexical analyzer 630, which checks or verifies that the syntax of the program is appropriate. The goal is to see whether the primitives for software-defined architecture are being used with appropriately formatted parameters and instructions. Then the semantic analyzer 640 determines the meaningfulness of the code. As shown in diagram 600, this is done at two levels. The operational semantic analyzer 650 checks whether the organization of the code is compliant with the language for software-defined architecture. Then the denotational semantic analyzer 660 validates the equivalence of expected and actual types of the inputs and outputs of each statements. Once the semantic analysis is completed, the translation of the high-level intermediate representation (HLIR) to the mid-level intermediate representation (MLIR) is completed, where the MLIR contains the language primitives of the software-defined architecture.

Figure 7A:
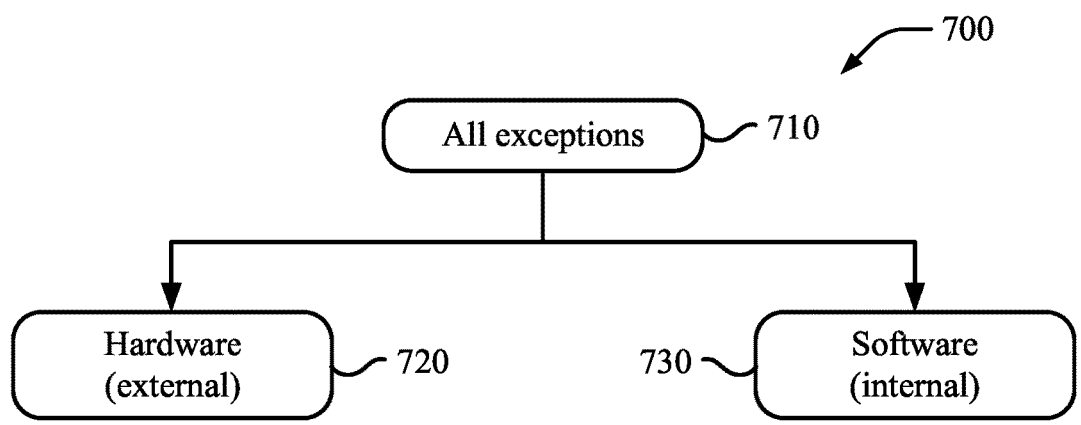
FIGS. 7A-7C are diagrams that illustrate an example of exception taxonomy in accordance with aspects of this disclosure.
Figure 7B:
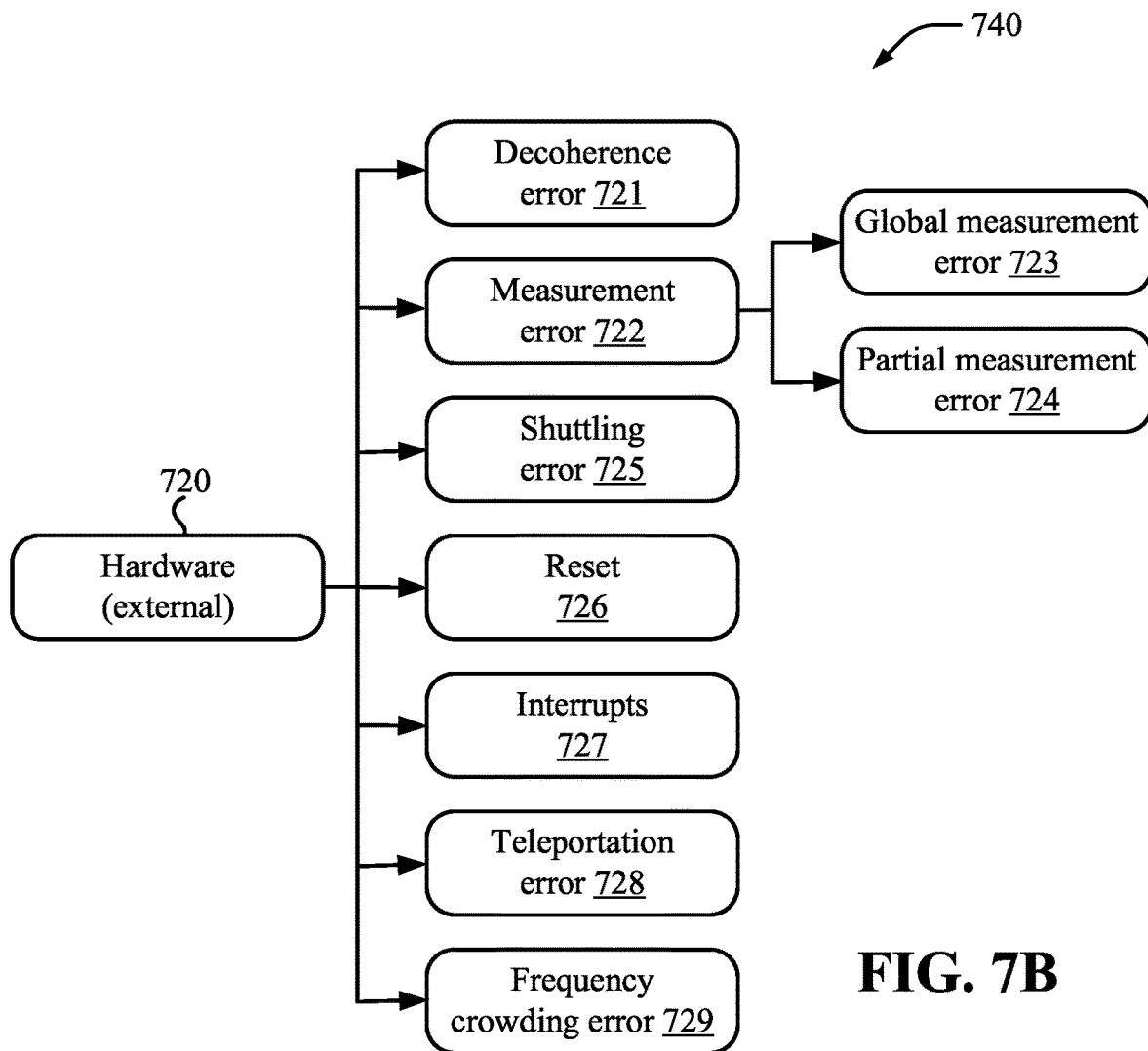
Figure 7C:
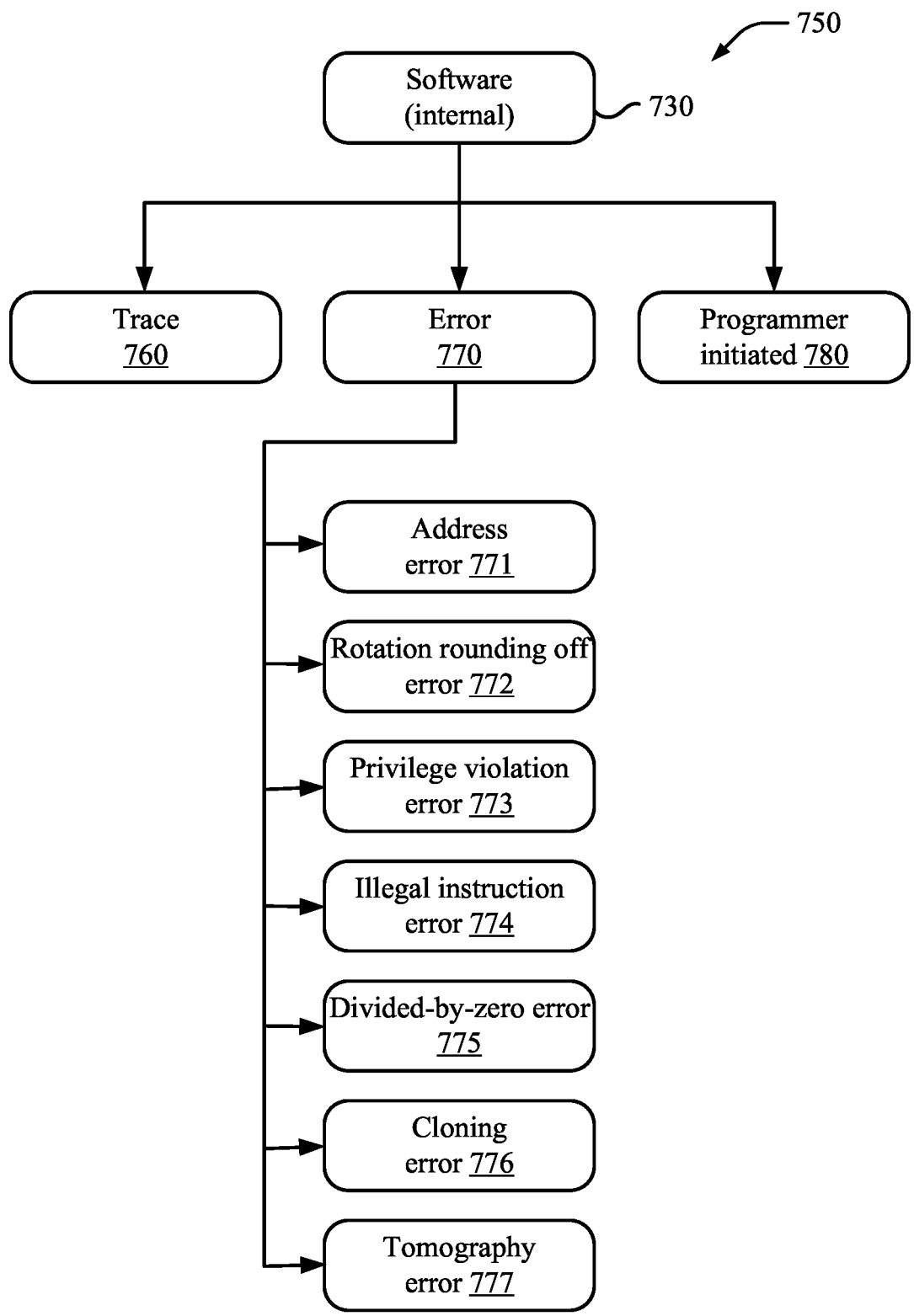

Another aspect related to the operation of software-defined QC architectures is exception handling. Exceptions can happen while a program is being executed on a software-defined quantum computer. FIGS. 7A-7C show diagrams 700, 740, and 750 that illustrate an example of exemption taxonomy in accordance with aspects of this disclosure. As shown in the diagram 700 in FIG. 7, exceptions 710 can rise from either hardware 720 or software 730. The API stack (see e.g., API stack 310) for the software-defined QC architecture is generally robust enough to handle these exceptions gracefully and return the exception messages with appropriate level of abstraction.

The diagram 740 in FIG. 7B shows the hardware exceptions 720. These exceptions may include, but need not be limited to, decoherence error 721, measurement error 722, shuttling error 725, reset 726, interrupts 727, teleportation error 728, and frequency crowding 729. A measurement error 722 can occur either from a global measurement error 723 or a partial measurement error 724.

The diagram 750 in FIG. 7C shows the software exceptions 730. These exceptions may include, but need not be limited to, stack trace 760, errors 770, and programmer initiated 780. The only programmer initiated exception is measurement. Software errors 770 include, but need not be limited to, address error 771, rotation rounding off error 772, privilege violation error 773, illegal instruction error 774, divided-by-zero error 775, cloning error 776, and tomography error 777. In a software-defined QC architecture a middle layer plays a crucial role in abstracting the hardware errors and handling a major number of software errors.

Figure 8:
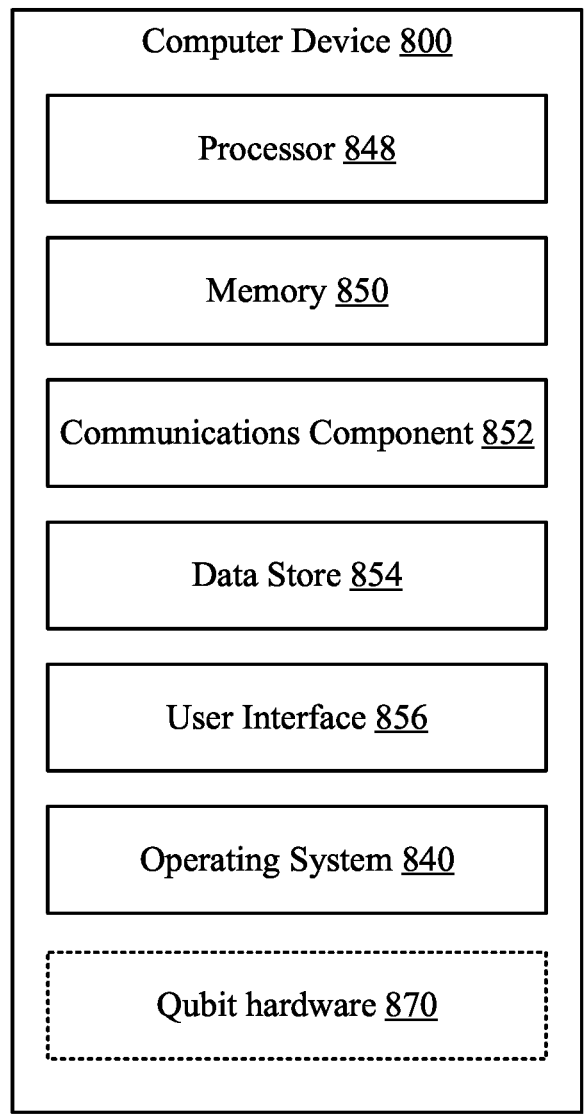
FIG. 8 is a diagram that illustrates an example of a computer device in accordance with aspects of this disclosure.

Referring now to FIG. 8, illustrated is an example computer device 800 in accordance with aspects of the disclosure. The computer device 800 can represent a single computing device, multiple computing devices, or a distributed computing system, for example. The computer device 800 may be configured as a quantum computer (or QC/QIP system), a classical computer, or a combination of quantum and classical computing functions. For example, the computer device 800 may implement some or all of the features described herein for a software-defined quantum computer, including modular expandability, architecture, resource manager functionality and workflow, API access points, and exception taxonomy/handling. Moreover, the computer device 800 may implement aspects of a classical computer to perform certain functions such as compiling, optimization, and the like. In addition, the computer device 800 may implement a combination of classical computer and quantum computer features sequentially and/or concurrently in order to enable the various aspects described herein. As such, the computer device 800 may include one or more of the hardware and/or software components described in connection with FIGS. 1-3.

More generally, the computer device 800 may include a processor 848 for carrying out processing functions associated with one or more of the features described herein. The processor 848 may include a single or multiple set of processors or multi-core processors. Moreover, the processor 848 may be implemented as an integrated processing system and/or a distributed processing system.

The processor 848 may include a central processing unit (CPU), a quantum processing unit (QPU), or both. As such, the processor 848 can be used to perform or implement classical operations, quantum operations, or a combination of classical operations and quantum operations.

The processor 848 may be used to, for example, implement at least a portion of control units, communication control units, and/or switch/router units (see e.g., FIGS. 1 and 2), to run at least a portion of programs, APIs and/or QOS (see e.g., FIGS. 1-3), and/or to implement aspects associated with qubit control (see e.g., FIGS. 1-3).

The processor 848 may be used to, for example, perform the resource manager workflow described in FIGS. 4A-4C, implement the levels of application programming interface (API) access points described in FIG. 5, implement functions of the compiler architecture described in FIG. 6, and/or implement the exceptions described in FIGS. 7A-7C.

The computer device 800 may include a memory 850 for storing data, which may include instructions executable by the processor 848 for carrying out the functions described herein. In an implementation, the memory 850 may correspond to a computer-readable storage medium that stores code or instructions to perform one or more of the functions or operations described herein. In one example, the memory 850 may include programs 110 and 110a in FIGS. 1 and 2. In another example, the memory 850 may be used to enable the software-defined quantum computer architecture described in FIG. 3 (e.g., by storing at least a portion of the QOS 320), the resource manager workflow in FIGS. 4A-4C, the levels of API access points described in FIG. 5, the compiler architecture described in FIG. 6, and/or the exceptions described in FIGS. 7A-7C.

Further, the computer device 800 may include a communications component 852 that provides for establishing and maintaining communications with one or more parties utilizing hardware, software, and services as described herein. The communications component 852 may carry communications between components on the computer device 800, as well as between the computer device 800 and external devices, such as devices located across a communications network and/or devices serially or locally connected to computer device 800. For example, the communications component 852 may include one or more buses, and may further include transmit chain components and receive chain components associated with a transmitter and receiver, respectively, operable for interfacing with external devices.

In an aspect, when the computer device 800 implements quantum operations, the communications component 852 may include and/or implement aspects of the communication control units (e.g., communication control units 220a and 220b) and the switch/router unit 230 in FIG. 2.

Additionally, the computer device 800 may include a data store 854, which can be any suitable combination of hardware and/or software, that provides for mass storage of information, databases, and programs employed in connection with implementations described herein. For example, the data store 854 may be a data repository for operating system 840 (e.g., classical OS, quantum OS, or both). In one implementation, the data store 854 may include the memory 850.

The computer device 800 may also include a user interface component 856 operable to receive inputs from a user of the computer device 800 and further operable to generate outputs for presentation to the user. The user interface component 856 may include one or more input devices, including but not limited to a keyboard, a number pad, a mouse, a touch-sensitive display, a digitizer, a navigation key, a function key, a microphone, a voice recognition component, any other mechanism capable of receiving an input from a user, or any combination thereof. Further, the user interface component 856 may include one or more output devices, including but not limited to a display, a speaker, a haptic feedback mechanism, a printer, any other mechanism capable of presenting an output to a user, or any combination thereof.

In an implementation, the user interface component 856 may transmit and/or receive messages corresponding to the operation of the operating system 840. In addition, the processor 848 may execute the operating system 840 and/or applications or programs, and the memory 850 or the data store 854 may store them.

When the computer device 800 is implemented as part of a cloud-based infrastructure solution, the user interface component 856 may be used to allow a user of the cloud-based infrastructure solution to remotely interact with the computer device 800. For example, the user may interact by providing an algorithm or simulation to be programmed for execution by the computer device 800.

In yet another aspect, the computer device 800, when implementing aspects of a quantum computer or QC/QIP system, may include qubit hardware 870. As mentioned above, the qubit hardware 870 may be based on one type of quantum technology, such as ion-trapped technology, in which case the qubit hardware 870 includes at least one ion trap to perform quantum operations. The qubit hardware 870 may be based on other types of quantum technology, such as superconducting technology, in which case the qubit hardware 870 includes superconducting circuits to perform quantum operations.

Although the present disclosure has been provided in accordance with the implementations shown, one of ordinary skill in the art will readily recognize that there could be variations to the embodiments and those variations would be within the scope of the present disclosure. Accordingly, many modifications may be made by one of ordinary skill in the art without departing from the scope of the appended claims.

What is claimed is:

1. A non-transitory computer-readable medium storing code with instructions executable by a processor for generating an intermediate representation of source code for a software-defined quantum computer, comprising:
   code for performing a lexical analysis on a high-level intermediate representation of a quantum programming language by checking or verifying a syntax of the source code;
   code for performing semantic analysis on an output of the lexical analysis by:
      checking whether an organization of the source code is compliant with an architecture of the software-defined quantum computer by checking if language primitives of the source code for the architecture are being used with formatted parameters and instructions that are appropriate for the software-defined quantum computer; and
      validating inputs types and outputs types of statements of the source code; and
   code for generating a mid-level intermediate representation of the quantum programming language based on an output of the semantic analysis that confirms the syntax of the source code is appropriate for the software-defined quantum computer.

2. The non-transitory computer-readable medium of claim 1, wherein the code for performing the semantic analysis includes code for performing both an operational semantic analysis and performing a denotational semantic analysis on the output of the lexical analysis.

3. The non-transitory computer-readable medium of claim 1, wherein the code for performing the lexical analysis comprises code for verifying the syntax on the high-level intermediate representation of a quantum programming language.

4. The non-transitory computer-readable medium of claim 1, wherein the code for performing the semantic analysis further includes code for validating an equivalence of expected and actual types of inputs and outputs of each statement of the quantum programming language.

5. The non-transitory computer-readable medium of claim 4, wherein the mid-level intermediate representation of the quantum programming language comprises the language primitives of the software-defined quantum computer.

6. A system for generating an intermediate representation of source code, the system comprising:
   a software-defined quantum computer;
   a medium storing code with executable instructions executable for generating an intermediate representation of source code for the software-defined quantum computer; and
   a processor that, when executing the code stored on the medium, is configured to:
      perform a lexical analysis on a high-level intermediate representation of a quantum programming language by checking or verifying a syntax of the source code;
      perform semantic analysis on an output of the lexical analysis by:
         checking whether an organization of the source code is compliant with an architecture of the software-defined quantum computer by checking if language primitives of the source code for the architecture are being used with formatted parameters and instructions that are appropriate for the software-defined quantum computer; and
         validating inputs types and outputs types of statements of the source code; and
      generate a mid-level intermediate representation of the quantum programming language based on an output of the semantic analysis that confirms the syntax of the source code is appropriate for the software-defined quantum computer.

7. The system of claim 6, wherein the processor that, when executing the code stored on the medium, is further configured to perform the semantic analysis by performing both an operational semantic analysis and performing a denotational semantic analysis on the output of the lexical analysis.

8. The system of claim 6, wherein the processor that, when executing the code stored on the medium, is further configured to perform the lexical analysis by verifying the syntax on the high-level intermediate representation of a quantum programming language.

9. The system of claim 6, wherein the processor that, when executing the code stored on the medium, is further configured to perform the semantic analysis by validating an equivalence of expected and actual types of inputs and outputs of each statement of the quantum programming language.

10. The system of claim 9, wherein the mid-level intermediate representation of the quantum programming language comprises the language primitives of the software-defined quantum computer.

* * * * *